United States Patent [19]
Ohashi

[11] Patent Number: 4,997,996
[45] Date of Patent: Mar. 5, 1991

[54] PRINTED WIRING BOARD MOUNTED ELECTRONIC COMPONENT

[75] Inventor: Shigeo Ohashi, Tokyo, Japan

[73] Assignee: Nihon Kaikeiki Kogyo Kabushiki Kaisha, Tokyo, Japan

[21] Appl. No.: 330,065

[22] Filed: Mar. 29, 1989

Related U.S. Application Data

[63] Continuation of Ser. No. 134,082, Dec. 17, 1987, Pat. No. 4,862,325.

[51] Int. Cl.⁵ ............................................. H05K 7/02
[52] U.S. Cl. .................................... 174/260; 361/400; 439/79; 439/571
[58] Field of Search ................ 361/400, 405; 174/260; 200/292, 294, 295; 439/79, 80, 59, 78, 329, 571, 629; 248/27.1, 27.3

[56] References Cited

U.S. PATENT DOCUMENTS

| | | | |
|---|---|---|---|
| 3,706,869 | 12/1972 | Sorenson | 200/295 |
| 3,780,353 | 12/1973 | Gordon et al. | 248/27.1 |
| 4,080,522 | 3/1978 | Schimmels | 200/295 |
| 4,254,301 | 3/1981 | Serino | 174/138 G |
| 4,707,765 | 11/1987 | Ohashi | 200/296 |
| 4,717,218 | 1/1988 | Ratcliff | 439/59 |

FOREIGN PATENT DOCUMENTS 2549330  5/1977  Fed. Rep. of Germany ...... 439/131

Primary Examiner—Leo P. Picard
Assistant Examiner—Paramita Ghosh
Attorney, Agent, or Firm—Birch, Stewart, Kolasch & Birch

[57] ABSTRACT

A printed wiring board is mounted with an electronic component which is provided with grooves at the opposite sides thereof. The grooves are constructed so that the electronic component can be mounted on the printed wiring board in either the vertical or horizontal directions. Preferably, the grooves have a cross-shaped configuration, one extending vertically and one extending horizontally. The grooves may be formed on tongue pieces projecting from the electronic component body. The groove may be provided with a resilient piece. Another groove may be provided on the body so as to be capable of changing the direction of terminals.

12 Claims, 3 Drawing Sheets

PRINTED WIRING BOARD MOUNTED ELECTRONIC COMPONENT

This application is a continuation of copending application Ser. No. 07/134,082, filed on Dec. 17, 1987 now U.S. Pat. No. 4,862,325 issued Aug. 29, 1987.

BACKGROUND OF THE INVENTION

The present invention relates to an electronic component such as a switch, a connector, etc, and more particularly to improvements in an electronic component which is mounted on a printed wiring board.

There have been proposed many types of electronic components such as a switch, a connector, etc., which are to be mounted on a printed wiring board. FIG. 13 is a perspective view showing examples of conventional switches of such a type. In FIG. 13, a switch generally designated by a which is exclusively provided for vertical use is mounted on a printed wiring board in a vertical direction, and a switch generally designated by b which is exclusively provided for horizontal use is mounted on a printed wiring board in a horizontal direction. The switch a comprises a switch body 11, a sleeve 12 attached to the body 11 at the top portion thereof and a switch lever 13 pivotally mounted within the sleeve 12. The body 11 is provided with a bracket 25 which covers the body 11. The bracket 25 has a plurality of downwardly extending pawl pieces 25a which are inserted into apertures 15c formed on a printed wiring board 15 and frictionally held therein. Furthermore terminals 16 of the switch a are inserted in the apertures 15c and provide electric connections. Thus, switch a is for vertically exclusive use so that the lever 13 is located above the body 11 when the switch a is mounted on the board 15. The switch b comprises a body 11, a sleeve 12 and a lever 13 similar to the switch a. However, in the case of the switch b, a metal mounting 24 is attached between the body 11 and the sleeve juxtaposed with each other. A plurality of pawl pieces 24a extend downward from the metal mounting 24 and are inserted into the apertures 15c of the board 15 to be frictionally held therein. Thus, the switch b is for exclusive horizontal use so that the lever 13 is located at the side of the body 11 when the switch b is mounted on the board 15.

Furthermore, as an example of a conventional switch, there has been proposed a structure in which a board is formed with a cut-out and an electronic component is attached to the cut-out portion. This structure is disclosed in the Japanese Patent Application Nos. 155774/1984 and 207515/1984 and the Japanese Utility Model Application No. 189556/1984, which all pertain to the same applicant as that of the present application.

However, the electronic components including central instruments of the above-mentioned prior art were for exclusive vertical or horizontal use and there is no electronic component which can be mounted on a board-in either the vertical or horizontal direction, if desired.

SUMMARY OF THE INVENTION

It is, therefore, an object of the present invention to provide a novel electronic component which can be optionally mounted on a printed wiring board in either the vertical or horizontal direction, if desired.

In order to accomplish the foregoing object, the printed wiring board mounted electronic component according to the present invention has a featured construction wherein the electronic component body is provided at opposite thereof ends with a cross-shaped groove or hole which extends horizontally and vertically and by utilizing the cross-shaped groove, the electronic component is insertable into the cut-out of the printed wiring board either in a horizontal direction or in a vertical direction.

DESCRIPTION OF THE DRAWING

Other features and advantages of the invention will be apparent from the following description taken in connection with the accompanying drawing wherein.

DESCRIPTION OF THE PREFERRED EMBODIMENTS

The present invention will now be described in detail by referring to the embodiments shown in the accompanying drawing.

Figure 1:
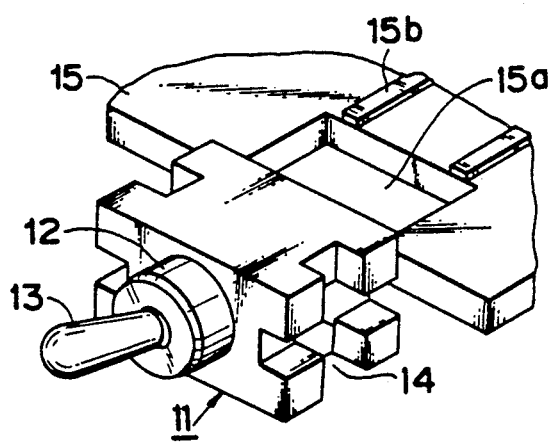
FIG. 1 is a perspective view of a first embodiment of a printed wiring board mounted electronic component according to the present invention.
Figure 2:
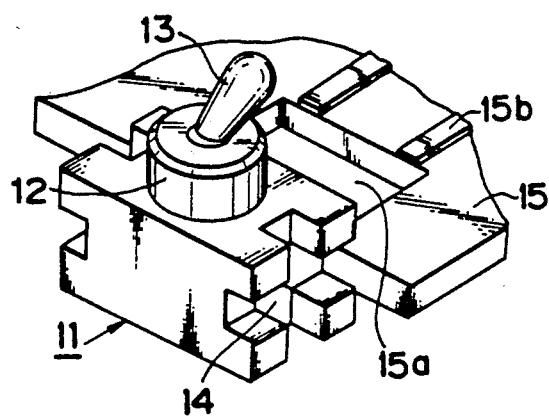
FIG. 2 is a perspective view, similar to FIG. 1, showing a manner in which an electronic component is mounted on a board in a direction different from that of FIG. 1.
Figure 3:
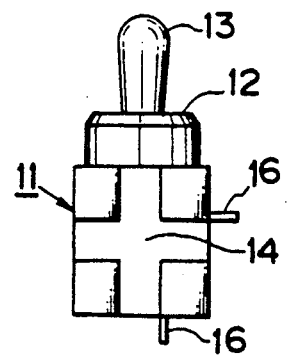
FIG. 3 is a side view showing a main portion of the electronic component of FIG. 1.

Firstly, reference is made to FIGS. 1 to 3. Reference numeral 11 designates a switch body, embodying the invention. The body 11 is provided at the upper portion thereof (FIG. 2) with a sleeve 12 in which a switch lever 13 is pivotally mounted. The sleeve 12 is provided inside thereof with a switching mechanism, not shown, operable to be switched by the lever 13.

The switch body 11 is formed at the opposite ends with a cross-shaped groove 14 extending in vertical and horizontal directions. FIG. 1 shows that the body 11 is mounted to a printed wiring board 15 at the cut-out 15a thereof in such a manner that the body 11 is laid relative to the board 15 and FIG. 2 shows that the body 11 is mounted to the board 15 in such a manner that the body 11 stands relative to the board 15.

Furthermore, a reference numeral 15b designates a copper foil which is brought into engagement with the terminal 16 (FIG. 3) when the body 11 is mounted to the board 15.

Figure 4:
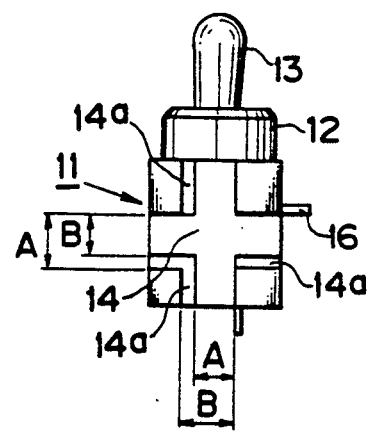
FIG. 4 is a side view showing a main portion of the electronic component of a second embodiment.

FIG. 4 is a side view showing a main portion of a second embodiment. In the second embodiment, the switch body 11 is adapted to be mounted on boards having different thicknesses. More particularly, the groove 14 of the body 11 is formed with stepped portions 14a, 14a, and therefore the body 11 can be mounted on boards of two different thicknesses (i.e. two types of board of different thicknesses A and B in this embodiment).

Figure 5:
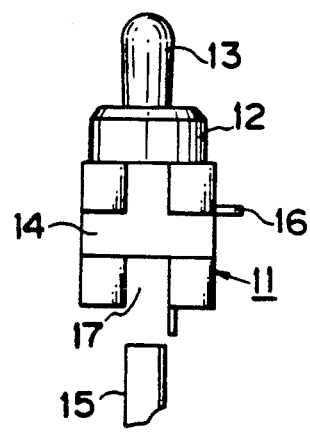
FIG. 5 is a side view showing a main portion of an electronic component of a third embodiment.

FIG. 5 is a side view showing a main portion of a third embodiment. In the third embodiment, the body 11 is adapted to be mounted at the end portion or bottom portion thereof on the board 15 without cut-outs. The body 11 is formed at the bottom portion thereof with a groove 17 which communicates with the lower portions of the opposite cross-shaped grooves 14. The body 11 is mounted on the board 15 by engaging the groove 17 of the body 11 with the end portion of the board 15. Although, as seen in FIG. 5 the body 11 is mounted on the board in such a manner that the body is laid relative to the board, in the case where the body 11 is intended to be mounted on the board vertically, a groove is formed on one or opposite sides of the body instead of the groove 17.

Figure 6:
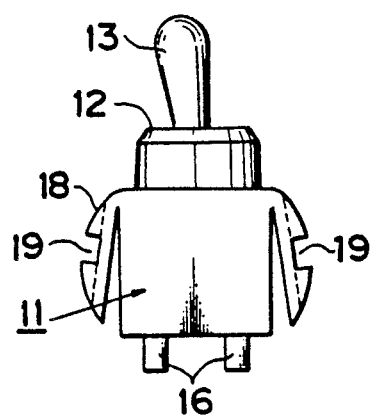
FIG. 6 is a front view showing a fourth embodiment.
Figure 7:
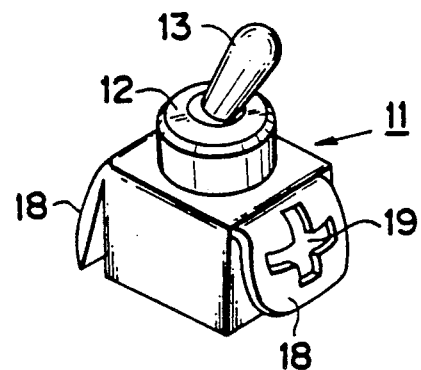
FIG. 7 is a perspective view showing the fourth embodiment.

FIGS. 6 and 7 are a front and a perspective views showing a fourth embodiment of the present invention. In the fourth embodiment, the body 11 is provided at the opposite sides thereof with tongue pieces 18 extending downward from the upper portions of the body 11, and each tongue is formed with a cross-shaped groove or hole 19 extending vertically and horizontally. It is preferred that the tongue piece 18 is made of a material having a slight resiliency. Furthermore, when the tongue pieces are constructed so that the center portions of tongue pieces are convex as seen in FIG. 6, the body 11 is capable of being mounted on the board either in vertical or horizontal direction. In the switch of the embodiment, the switch body 11 can be mounted to the cut-out formed on the board as well as the opening formed at any portion of the board 15.

Furthermore, in the embodiment, if stepped portions, not shown, are conveniently formed in the grooves 19, the body 11 can be mounted on the boards of different thicknesses or can be adjustably mounted and fixed on the board at any suitable height in the board in accordance with the thickness of board.

Furthermore, although the tongue piece 18 extends from the upper portions of the body 11, as an alternative, the tongue pieces can be formed so as to extend from the lower portions of the body.

Figure 8:
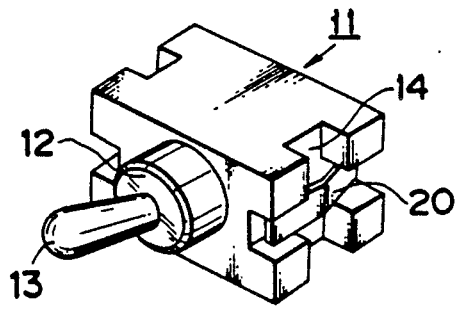
FIG. 8 is a perspective view showing a fifth embodiment.
Figure 9:
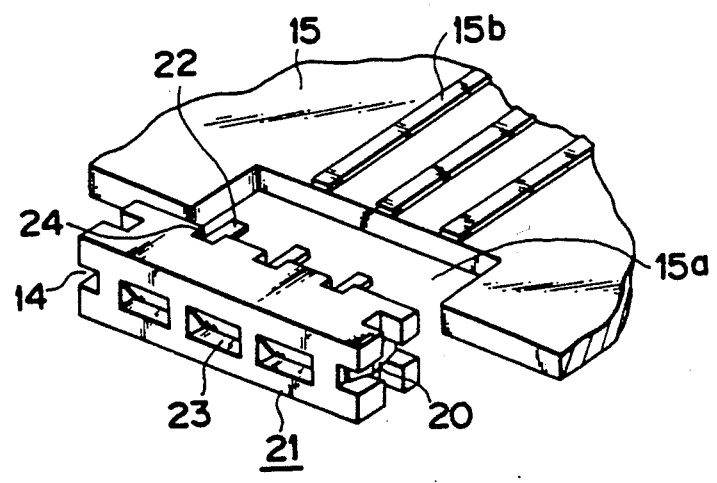
FIG. 9 is a perspective view showing a sixth embodiment.
Figure 10:
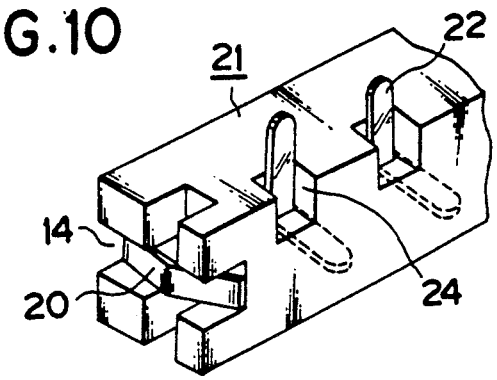
FIG. 10 is a perspective view showing a main portion of the sixth embodiment as viewed in an angle different from that of FIG. 9.

FIG. 8 is a perspective view showing a fifth embodiment of the present invention. In this embodiment, a resilient piece 20 is provided within the cross-shaped groove 14 as in the first through third embodiments shown in FIGS. 1 through 5. The resilient piece provides a resilient action on the body 11 which is inserted vertically or horizontally. With this construction, the body is rigidly fixed on the board.

Figure 11:
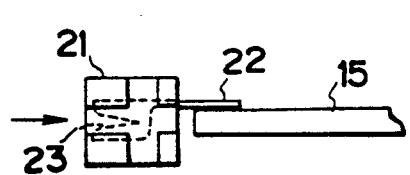
FIG. 11 is a side view showing the sixth embodiment.
Figure 12:
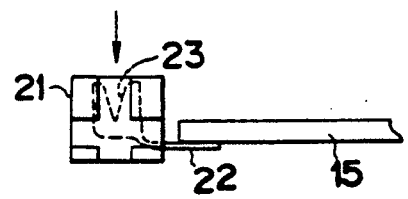
FIG. 12 is a side view similar to the FIG. 11.
Figure 13:
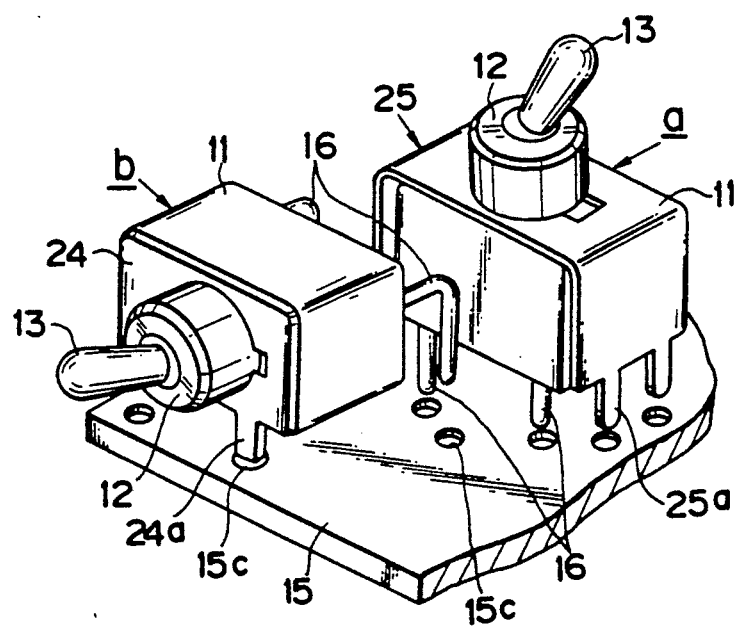
FIG. 13 is a perspective view showing switches of prior art.

FIGS. 9 to 12 show a sixth embodiment according to the present invention. In this embodiment, the invention is applied to a connector (a female connector). In FIGS. 9 to 12, reference numerals 21 to 24 designate a connector body, a terminal, a resilient contact plate and a groove 24, respectively More particularly, the connector body 21 is formed at the opposite sides thereof with cross-shaped grooves 14 extending in vertical and horizontal directions. A resilient piece 20 is provided within each groove 14. The connector body 21 is mounted on the printed wiring body 15 by inserting the body into the cut-out 15a of the board 15 in a manner similar to that of the above-mentioned switch body. At this time, the resilient piece 20 functions to rigidly fix the connector body 21 to the board 15. FIG. 11 shows that the connector body 21 is laterally or horizontally mounted to the board 15. In this case, a male connector, not shown, is connected to the female connector from a sidewise direction as shown by an arrow. When the connector body is mounted to the board so that the body stands relative to the board as shown in FIG. 12, the directions of the terminals 22 are changed within the grooves 24. In this case, the male connector is connected to the female connector 21 mounted to the board from the upper side as shown by an arrow.

Furthermore, the resilient piece 20 may be made integrally with the connector body instead of an individual metal plate.

Furthermore, although the groove 14 has been explained to be cross-shaped, it is not limited to that configuration and it may be of any shape so that the electronic component can be mounted on the board in either a vertical or horizontal directions.

Although the present invention has been explained with respect to the toggle switch and the connector, it also can be applied to electronic components such as a slide switch, a corrugated switch, a relay, etc.

The present invention is constructed as mentioned above and the following advantages are obtained in accordance with the present invention:

(1) By providing the cross-shaped groove extending vertically and horizontally on the opposite sides of the body, an electronic component can be mounted on the printed wiring board in either a vertical or horizontal directions, if desired.

(2) Since the grooves of the body can engage with the cut-out of a board, there is no necessity for utilizing conventional special brackets (mounting metals). Furthermore the body can be rigidly mounted on the board.

(3) Since the body is inserted into the cut-out of a board so as to accommodate the thickness of the board, the space can be made small.

(4) By providing stepped portions within the grooves or holes of the body, the body can be mounted on a board of different thicknesses.

(5) Since the body can be easily mounted on the board by grooves or holes provided on the opposite sides of the body, no offset is generated between the pattern of the board and the terminals of the switch during a soldering operation in subsequent steps.

What we claim is:

1. A printed wiring board mounted with at least one electronic component,
    said printed wiring board having cut out portions, and
    said electronic component having a generally rectangular shape with cross-shaped grooves formed on the opposite side portions thereof, each cross-shaped groove including a first groove portion and a second groove portion disposed perpendicular to each other,
    a resilient member provided within at least one of the cross-shaped grooves,
    whereby said electronic component can be mounted on said wiring board in a first direction relative to said wiring board by engaging said first groove portions with the opposite side walls of the cut out portion of the printed wiring board, or in a second direction perpendicular to said first direction by engaging said second groove portions with said opposite side walls of said cut out portion of the printed wiring board.

2. The printed wiring board of claim 1 wherein the electronic component is a switch.

3. The printed wiring board of claim 1 wherein stepped portions are provided within both groove portions of each of said cross-shaped grooves.

4. The printed wiring board of claim 1 wherein a straight groove is formed on the bottom portion of said electronic component so that it is adapted to engage an end portion of the printed wiring board.

5. An electronic component adapted to be mounted within a cut-out portion of a printed wiring board,
   said electronic component having a generally rectangular shape with cross-shaped grooves formed on the opposite side portions thereof, each cross-shaped groove including a first groove portion and a second groove portion disposed perpendicular to each other,
   a resilient member provided within at least one of the cross-shaped grooves,
   whereby said electronic component can be mounted on said printed wiring board in a first direction relative to said wiring board by engaging said first groove portions with the opposite side walls of the cut out portion of the printed wiring board, or in a second direction perpendicular to said first direction by engaging said second groove portions with said opposite side walls of said cut out portion of the printed wiring board.

6. A printed wiring board mounted with at least one electronic component,
   said printed wiring board having cut out portions, and
   said electronic component having a generally rectangular shape with cross-shaped grooves formed on the opposite side portions thereof, each cross-shaped groove including a first groove portion and a second groove portion disposed perpendicular to each other,
   a first group of terminals provided to project parallel to said first groove portion of said cross-shaped groove, and
   a second group of terminals provided to project parallel to said second groove portion of said cross-shaped groove,
   whereby said electronic component can be mounted on said wiring board in a first direction relative to said wiring board by engaging said first groove portions with the opposite side walls of the cut out portion of the printed wiring board, or in a second direction perpendicular to said first direction by engaging said second groove portions with said opposite side walls of said cut out portion of the printed wiring board.

7. The printed wiring board of claim 6, wherein a resilient member is provided within at least one of the cross-shaped grooves.

8. The printed wiring board of claim 6, wherein stepped portions are provided within both groove portions of each of said cross-shaped grooves.

9. The printed wiring board of claim 6, wherein a straight groove is formed on the bottom portion of said electronic component so that it is adapted to engage an end portion of the printed wiring board.

10. An electronic component adapted to be mounted within a cut-out portion of a printed wiring board,
    said electronic component having a generally rectangular shape with cross-shaped grooves formed on the opposite side portions thereof, each cross-shaped groove including a first groove portion and a second groove portion disposed perpendicular to each other,
    a first group of terminals provided to project parallel to said first groove portion of said cross-shaped groove, and
    a second group of terminals provided to project parallel to said second groove portion of said cross-shaped groove,
    whereby said electronic component can be mounted on said printed wiring board in a first direction relative to said wiring board by engaging said first groove portions with the opposite side walls of the cut out portion of the printed wiring board, or in a second direction perpendicular to said first direction by engaging said second groove portions with said opposite side walls of said cut out portion of the printed wiring board.

11. The printed wiring board of claim 10, wherein stepped portions are provided within both groove portions of each of said cross-shaped grooves.

12. The printed wiring board of claim 10, wherein a straight groove is formed on the bottom portion of said electronic component so that it is adapted to engage an end portion of the printed wiring board.

* * * * *